United States Patent
Fu et al.

(10) Patent No.: US 6,249,139 B1
(45) Date of Patent: Jun. 19, 2001

(54) LIFETIME MEASUREMENT OF AN ULTRA-THIN DIELECTRIC LAYER

(75) Inventors: Kuan-Yu Fu, Hsinchu; Mainn-Gwo Chen, Taichung; Chuan H. Liu, Taipei, all of (TW)

(73) Assignees: United Microelectronics Corp.; United Semiconductor Corp., both of Hsinchu (TW)

( * ) Notice: Subject to any disclaimer, the term of this patent is extended or adjusted under 35 U.S.C. 154(b) by 0 days.

(21) Appl. No.: 09/393,054

(22) Filed: Sep. 9, 1999

(51) Int. Cl.[7] .................................................. G01R 31/26
(52) U.S. Cl. ............................ 324/766; 324/765; 324/520
(58) Field of Search ................................... 324/765, 766, 324/520, 769, 522

(56) References Cited

U.S. PATENT DOCUMENTS 5,804,975 * 9/1998 Alers et al. ............................ 324/613
6,043,662 * 3/2000 Alers et al. ............................ 324/520

OTHER PUBLICATIONS

Dielectric Reliability Measurement Methods: A Review, Andreas Martin, Paula O'Sullivan, and Alan Mathewson, 1998, Published in Microelectronics and Reliability, vol. 38, No.1.

New Experimental Findings on SILC and Soft Breakdown of Ultra–Thin Gate Oxides, M.G. Chen, C.H. Liu, M.T. Lee, and K.Y. Fu.

* cited by examiner

Primary Examiner—Ernest Karlsen
Assistant Examiner—Minh Tang
(74) Attorney, Agent, or Firm—Thomas, Kayden, Horstemeyer & Risley

(57) ABSTRACT

A method is described for taking a lifetime measurement of an ultra-thin dielectric layer. In order to discover the life time of the ultra-thin dielectric layer, the measurement comprises using about one half of a stress voltage to measure a time-dependent leakage current of the ultra-thin dielectric layer.

5 Claims, 5 Drawing Sheets

LIFETIME MEASUREMENT OF AN ULTRA-THIN DIELECTRIC LAYER

BACKGROUND OF THE INVENTION

1. Field of the Invention

The invention relates to a lifetime measurement of a semiconductor device, and more particularly, to a lifetime measurement of an ultra-thin dielectric layer.

2. Description of the Related Art

When the requirements for the integration of the integrated circuit increase, the requirements for an ultra-thin dielectric layer with low leakage current also increases. Generally, a dielectric layer having a thickness less than 50 Å is called an ultra-thin dielectric layer. At such a thickness, the test of the reliability of the ultra-thin dielectric layer plays an important role in quality control.

Generally, the reliability of a dielectric layer can be obtained by performing a time-dependent dielectric breakdown (TDDB) test under a constant voltage stress (CVS). The applied stress voltage is far greater than the device's operating voltage. As shown in FIG. 1, in the TDDB test, the current increases with the stress time, and after a period, the current dramatically increases. The phenomenon is called hard breakdown (HBD).

In fact, in the TDDB test for an ultra-thin dielectric layer, the soft breakdown (SBD) and the stress-induced leakage current (SILC) are also observed as shown in FIG. 2. Furthermore, in the traditional TDDB test, the quality of the SILC curve is generally poor, and the SBD curve is not remarkable. However, if the SBD and the SILC are not taken into account, the reliability of an ultra-thin dielectric layer is easily overestimated. As a result, the ultra-thin dielectric quality cannot be efficiently estimated.

In Microelectronic and Reliability (1998, pp37–72), A. Martin et al. have mentioned that the SBD and the SILC of the ultra-thin dielectric layer may be more easily monitored at a lower stress voltage. However, they did not point out a preferred stress voltage for monitoring the SBD and the SILC.

SUMMARY OF THE INVENTION

According to above, the invention provides a lifetime measurement of an ultra-thin dielectric layer. The measurement applies to a substrate having a gate oxide layer and a gate. The substrate is coupled with a ground. A stress-and-measurement cycle is performed to detect a gate current. The cycle comprises the following steps. The gate is subjected to a first constant stress voltage. When the measurement of the gate current is performed, the gate is subjected to a second constant stress voltage in which the voltage is about one half of the first constant stress voltage. The high-voltage stress (i.e. the first constant stress voltage) and the low-voltage stress (i.e. the second constant stress voltage) are repeated until the SBD is detected.

According to the invention, the stress-induced leakage stress and the soft breakdown can be easily measured, and the lifetime of the ultra-thin dielectric layer can be obtained accordingly. Thus, the invention provides an efficient measurement method for lifetime estimation of ultra-thin dielectrics with SILC and SBD being taken into account.

It is to be understood that both the foregoing general description and the following detailed description are exemplary, and are intended to provide further explanation of the invention as claimed.

DESCRIPTION OF THE PREFERRED EMBODIMENTS

In this embodiment, a 3.3 nm ultra-thin gate oxide layer is used as an example. However, the invention is not restricted to the 3.3 nm ultra-thin gate oxide layer.

Figure 1:
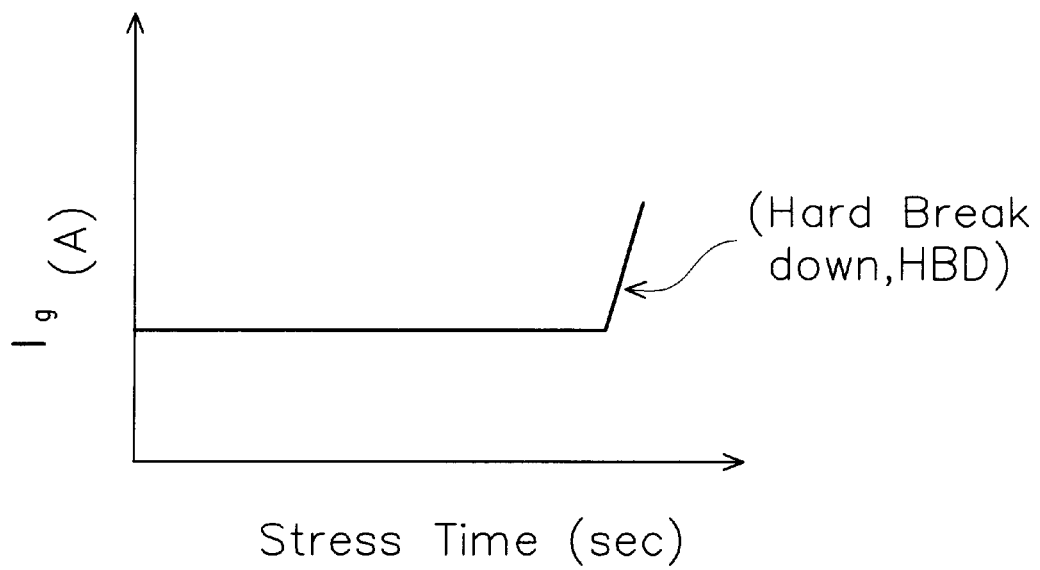
FIG. 1 plots gate current versus stress time for a gate dielectric layer under a CVS.
Figure 2:
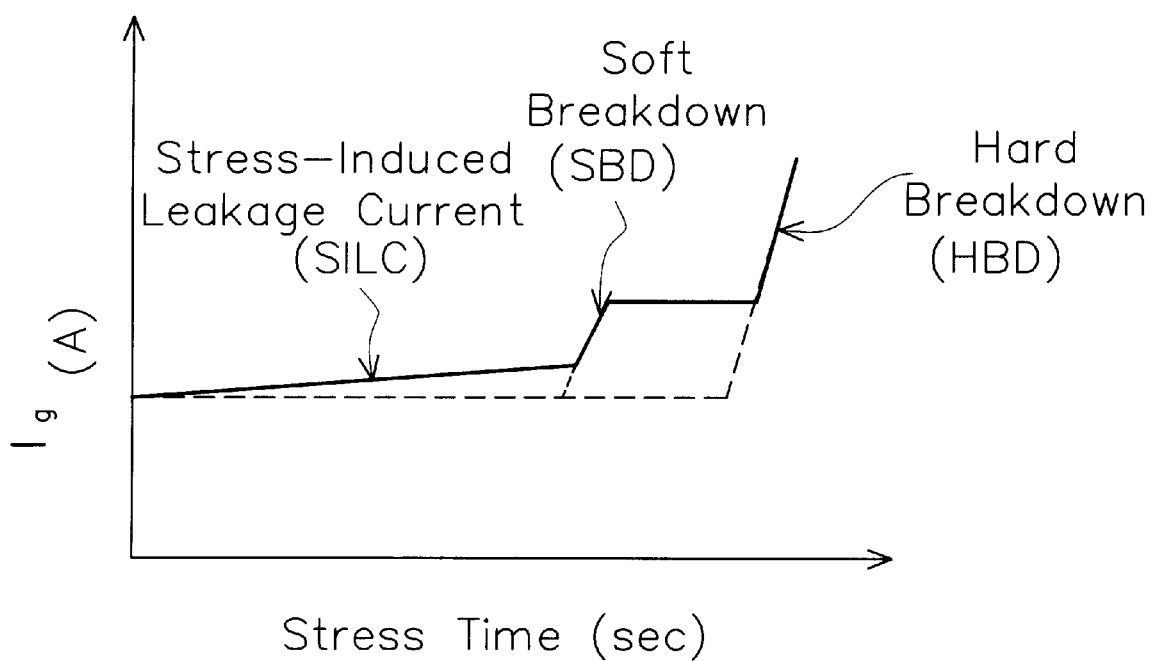
FIG. 2 plots gate current versus stress time for an ultra-thin gate dielectric layer under a CVS.
Figure 3:
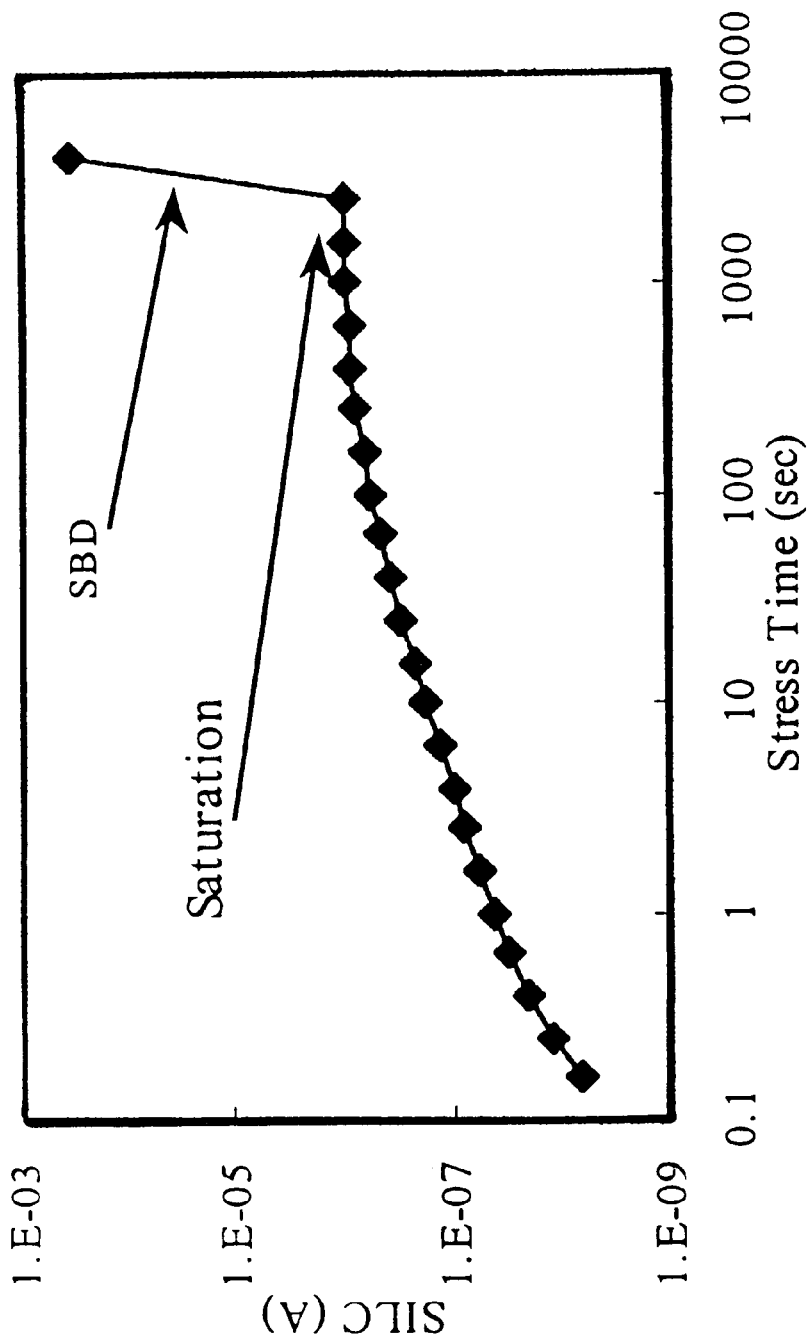
FIG. 3 plots SILC versus stress time under a constant stress voltage of about 5.1 V in log-log scale for the 3.3 nm gate oxide layer as an example.

Referring to FIG. 3, FIG. 3 plots SILC versus stress time under a constant stress voltage of about 5.1 V in log-log scale for the 3.3 nm gate oxide layer as an example. The vertical axis represents the gate current, and the horizontal axis represents the stress time. In FIG. 3, the gate current increases with the time under a CVS. This stage is called SILC. After a period of about 3200 seconds, the gate current dramatically increases. This stage is called SBD.

Figure 4:
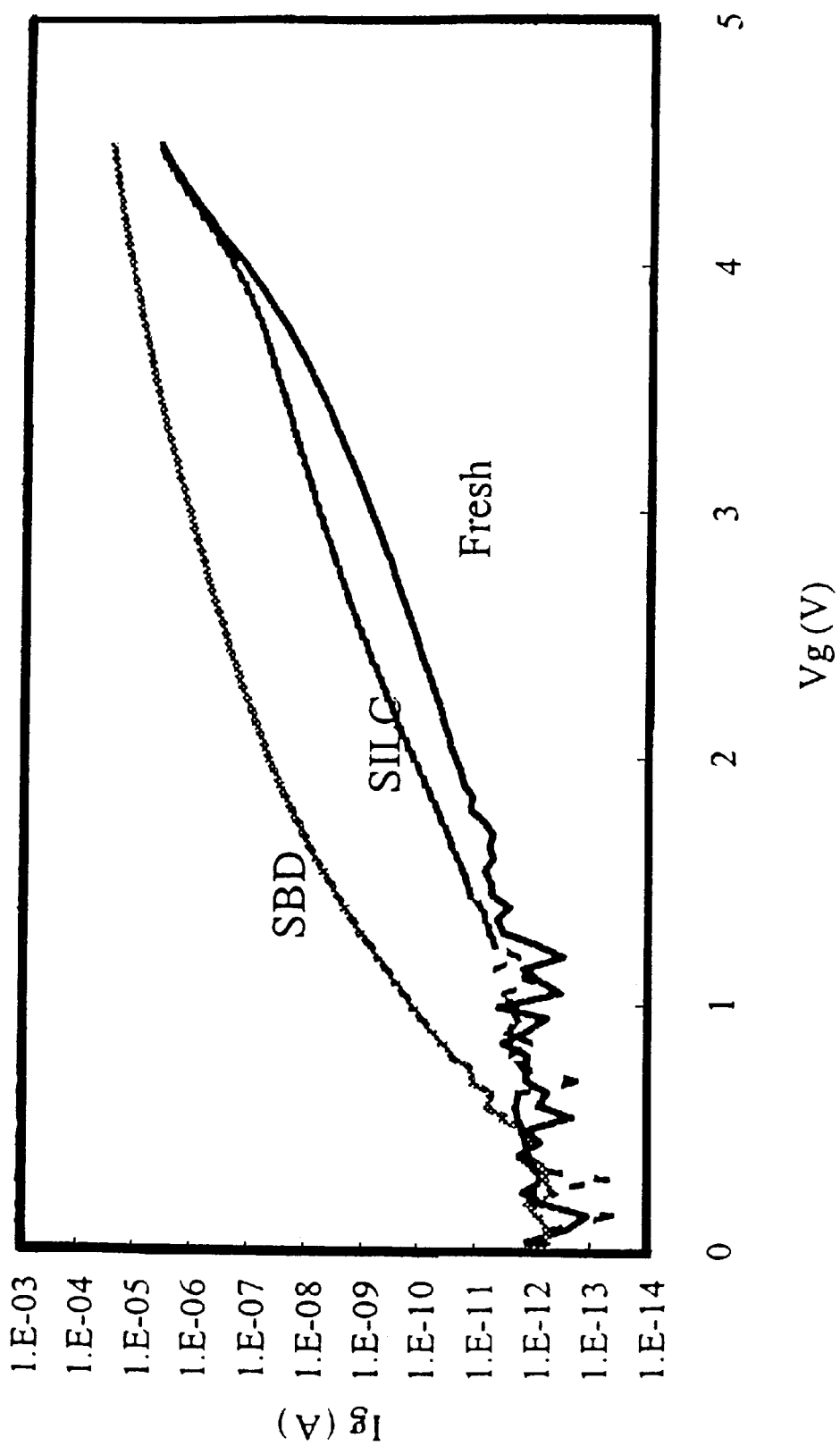
FIG. 4 shows the relations between gate currents and gate voltages obtained from FIG. 3 at different periods, 0 seconds (fresh), 100 seconds (SILC), and 3200 seconds (SBD), for a 3.3 nm gate oxide layer as an example.

FIG. 4 shows the relations between gate currents ($I_g$) and gate voltages ($V_g$) obtained from FIG. 3 at different periods, 0 seconds (fresh), 100 seconds (SILC), and 3200 seconds (SBD), for the 3.3 mn gate oxide layer as an example. That is, FIG. 4 plots the gate voltage versus measured gate current.

Figure 5:
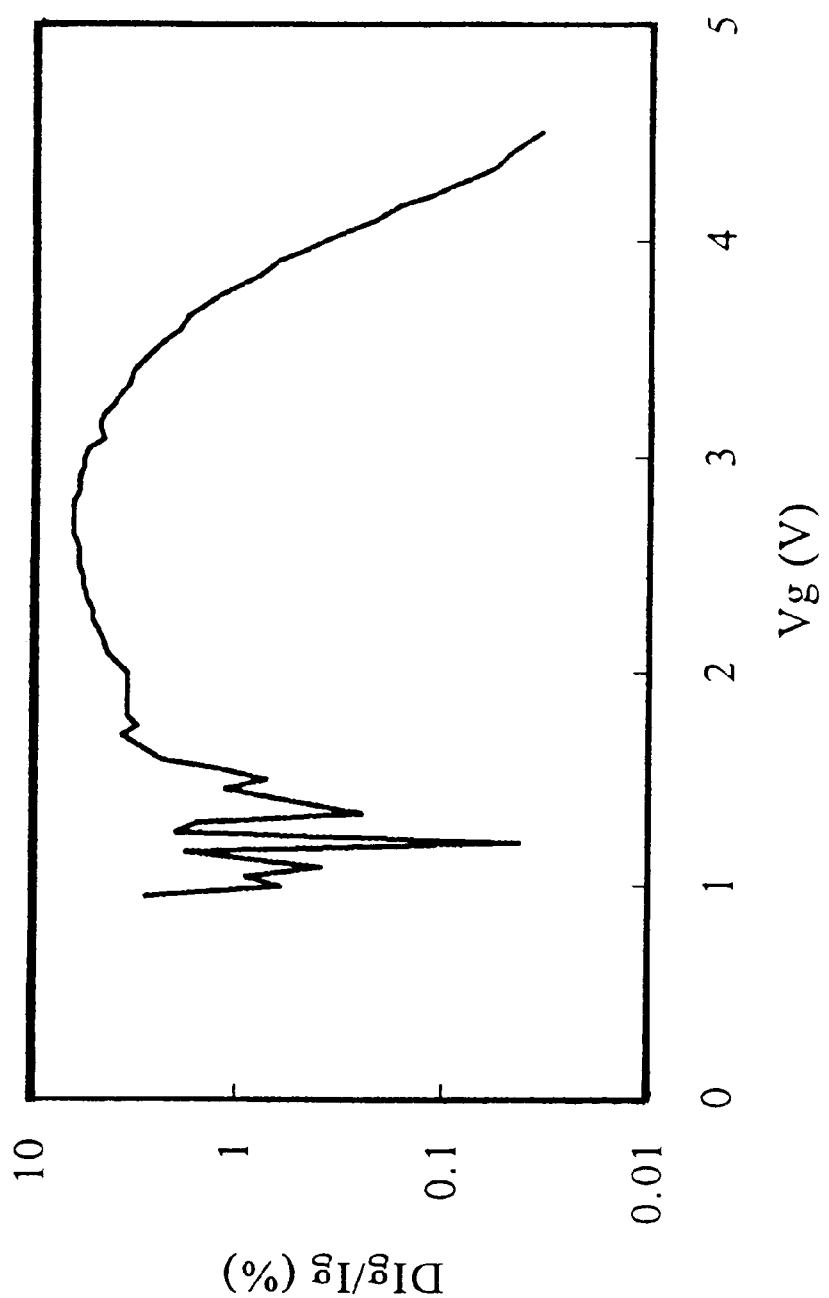
FIG. 5 plots the percentage change of SILC versus gate voltage for the 3.3 nm gate oxide layer as an example after the gate is subjected to a 5.1V constant stress voltage for about 100 seconds.

FIG. 5 plots the percentage change of SILC versus gate voltage for the 3.3 nm gate oxide layer as an example after the gate is subjected to a 5.1V constant stress voltage for about 100 seconds. The curve in FIG. 5 is obtained from $I_g(SILC)/I_g(Fresh) \times 100\%$, wherein $I_g(SILC)$ and $I_g(Fresh)$ represent the corresponding gate currents of the SILC curve and the Fresh curve in FIG. 4, respectively. The vertical axis is presented as $DI_g/I_g$, and the horizontal axis is the stress voltage.

FIG. 5 shows the SILC percentage change of peaks about 2.6V for the 5.1V CVS test. That is, SILC and SBD can be easily detected under a CVS test when the check voltage is set to be about one half of the stress voltage. Thus, the behavior can be used to characterize the SILC and the SDB and evaluate the gate oxide quality.

Figure 6:
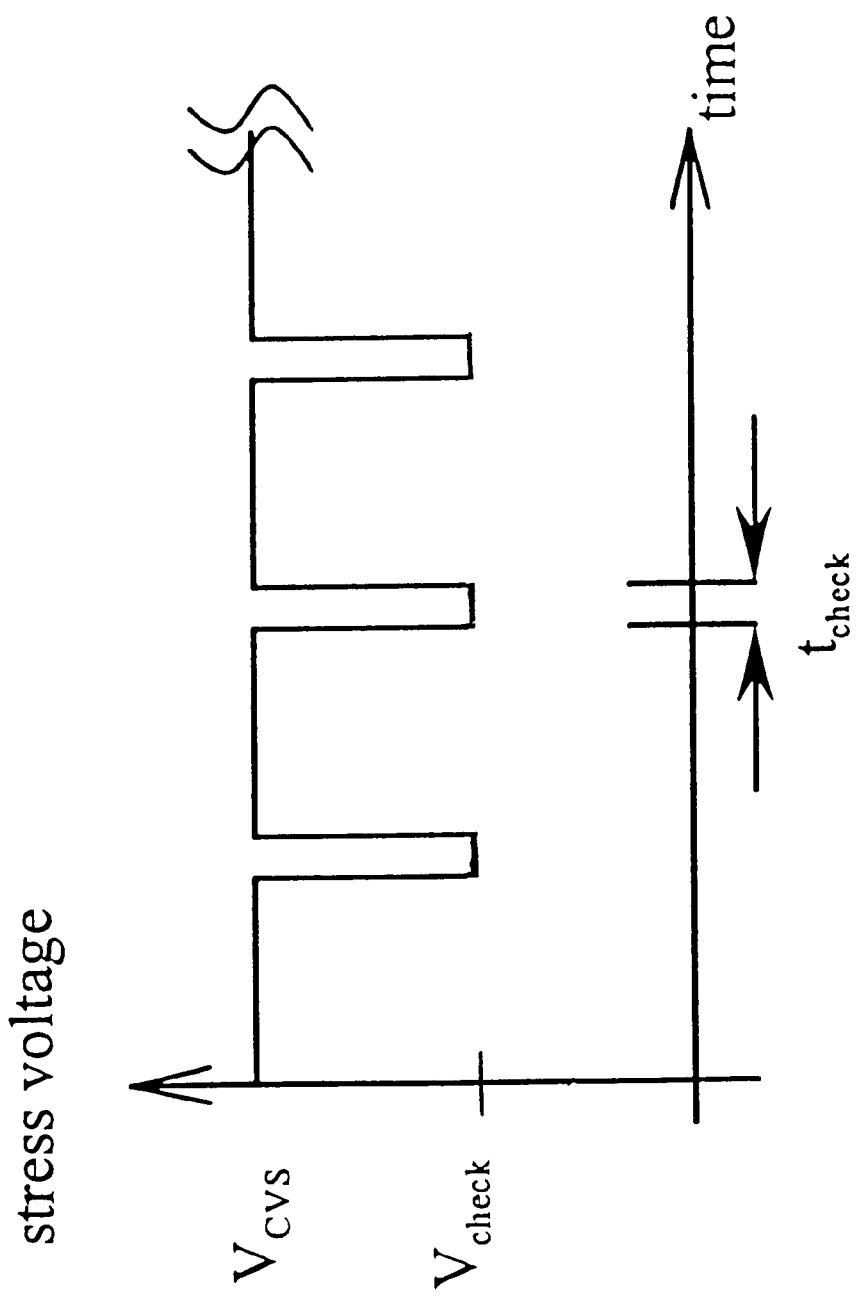
FIG. 6 shows a measurement method with low field checks for monitoring SILC and SBD during CVS test according the invention.

FIG. 6 shows the measurement method, according to the invention, with low field checks for monitoring SILC and SBD during TDDB CVS tests. $V_{CVS}$ is the stress voltage, $V_{check}$ is the check voltage (about $0.5V_{CVS}$) for the measurement of the gate current, and $t_{check}$ is the measurement time.

According to the preferred embodiment of the invention, the invention provides a sensitive way for easily measuring the stress-induced leakage current and the soft breakdown to efficiently evaluate the gate oxide quality and reliability.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A lifetime measurement of an ultra-thin dielectric layer, wherein the method applies to a substrate having a gate dielectric layer and a gate, and comprises:

coupling the substrate with a ground; and performing a stress-and-measurement cycle comprising:

applying a first constant voltage to the gate;

measuring a gate current by applying a second constant voltage to the gate, wherein the second constant voltage is about one half of the first constant voltage;

applying the first constant voltage to the gate again after completing a second constant voltage measurement; and repeating the cycle and stopping operation after detecting the breakdown of the gate dielectric layer through a change of the gate current.

2. The lifetime measurement of an ultra-thin dielectric layer of claim 1, wherein the breakdown of the gate dielectric layer comprises a soft breakdown of the gate dielectric layer.

3. The lifetime measurement of an ultra-thin dielectric layer of claim 1, wherein the breakdown of the gate dielectric layer comprises a hard breakdown of the gate dielectric layer.

4. The lifetime measurement of an ultra-thin dielectric layer of claim 1, wherein the gate dielectric layer comprises a gate oxide layer.

5. The lifetime measurement of an ultra-thin dielectric layer of claim 1, wherein a thickness of the gate dielectric layer is less than 5 nm.

* * * * *